Oct. 17, 1961 H. WEINSTEIN 3,005,107
PHOTOCONDUCTIVE DEVICES
Filed June 4, 1959
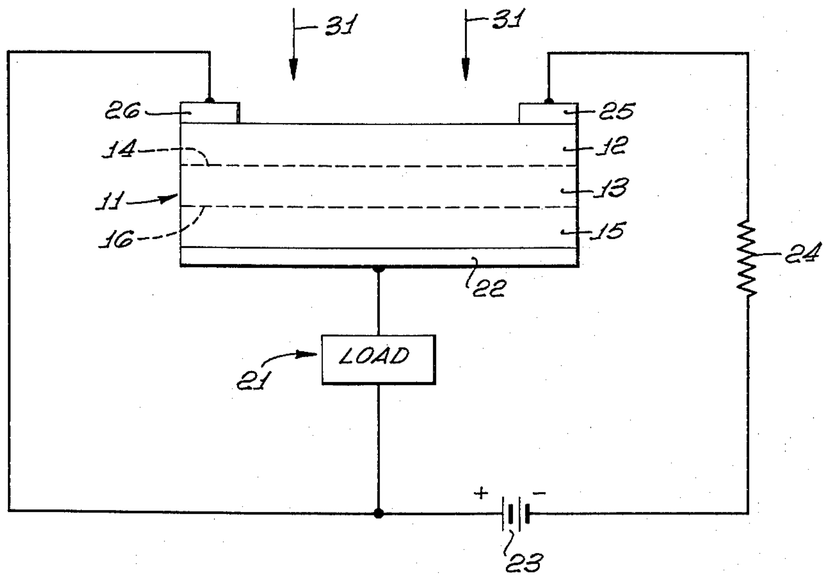
HAROLD WEINSTEIN
INVENTOR.
BY [signature]
ATTORNEY.

United States Patent Office 3,005,107
Patented Oct. 17, 1961

3,005,107
PHOTOCONDUCTIVE DEVICES

Harold Weinstein, Chicago, Ill., assignor to Hoffman Electronics Corporation, a corporation of California
Filed June 4, 1959, Ser. No. 818,089
4 Claims. (Cl. 250—211)

The present invention relates to photoconductive devices, and more particularly to semiconductor photoconductive devices having two p-n junctions.

A semiconductor photoconductive cell is a photocell, the resistance of which is change by incident radiation. Photoconductive cells require an external power supply in order to utilize this changing resistance. Photoconductive devices that conduct when light impinges upon them, and that do not conduct when the light is removed, are welll known in the art, but a satsfactory photoconductive device that does not conduct when light impinges upon it, and that conducts when the light is removed, is unknown. Such a device is very desirable.

It is an object of the present invention, therefore, to provide a novel photoconductive cell.

It is another object of the present invention to provide a photoconductive cell that does not conduct when light impinges upon it, and that conducts when the light is removed.

According to one embodiment of the present invention, a photoconductive cell comprises an n-p-n semiconductor device having one p-n junction back-biased so that when light impinges upon the photoconductive region, the device is not sufficiently back-biased to reach its Zener or breakdown voltage, but when the light is removed, the back-bias is increased beyond the Zener or breakdown voltage of the device and it conducts.

The features of the present invention which are believed to be novel are set forth with particularity in the appended claims. The present invention, both as to its organization and manner of operation, together with further objects and advantages thereof, may best be understood by reference to the following description, taken in connection with the accompanying drawing, in which, The sole figure is a side view of a photoconductive device and its associated electrical circuit according to the present invention.

Referring now to the drawing, the sole figure shows semiconductor device 11 having n-type region 12 and p-type region 13 separated by p-n junction 14, and n-type region 15 separated from p-type region 13 by p-n junction 16. N-type region 12 may be obtained by doping high resistivity p-type semiconductor material with a chemical such as phosphorus. The doping should be to a very shallow depth so that n-type region 12 will be photoconductive. One end of load 21 is connected to n-type region 15 through ohmic contact 22. Electroless or chemical plating with nickel or gold produces a very satisfactory ohmic contact. The other end of load 21 is connected to the positive terminal of battery 23, the negative termminal of which is connected to one end of resistor 24. The other end of resistor 24 is connected to n-type region 12 through ohmic contact 25. The positive terminal of battery 23 is connected to n-type region 12 through ohmic contact 26. The operation of the device of the sole figure will now be described.

The circuit parameters are chosen so that when little or no light falls upon n-type region 12, battery 23 back-biases p-n junction 16 beyond the Zener or voltage breakdown point, and semiconductor device 11 is, therefore, in the on, or conducting condition. When n-type region 12 is irradiated by light represented by arrows 31, photoconductive n-type region 12 provides a low resistance path between ohmic contacts 25 and 26. This results in a greater current passing through resistor 24, and the consequent increased voltage drop across resistor 24 causes a decrease in the back-bias. The circuit parameters are chosen so that the back-bias will then be insufficient to produce voltage breakdown, and semiconductor device 11 will switch into the off, or nonconducting condition, insofar as load 21 is concerned. When the light is removed, n-type region 12 will provide a high resistance path between ohmic contacts 25 and 26, the voltage drop across resistor 24 will decrease, p-n junction 16 will again be back-biased beyond voltage breakdown, and current will again pass through load 21.

It is to be understood that n-p-n semiconductor device 11 could be replaced by a p-n-p semiconductor device with a few minor changes, such as reversing the polarity of battery 23.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. A photoconductive device comprising: a semiconductor having first, second, and third regions, said first and third regions having n-type conductivity, said second region having p-type conductivity, said first and second regions being separated by a first p-n junction, said second and third regions beging separated by a second p-n junction, and said first region being photoconductive; first and second leads ohmically coupled to said first region, there being a high resistance path through said first region between said first and second leads when said first region is in a substantially non-illuminated condition and there being a low resistance path through said first region between said first and second leads when said first region is in a relatively illuminated condition; a third lead ohmically coupled to said third region, said first and third leads being coupled together through a load; a resistor; and a battery, said second and first leads being coupled together through said resistor in series with said battery, and said battery back-biasing said second p-n junction beyond voltage breakdown only when there is a high resistance path through said first region between said first and second leads.

2. A photoconductive device comprising: a semiconductor having first, second, and third regions, said first and third regions being of a first conductivity type, said second region being of a second conductivity type, said first and second regions being separated by a first p-n junction, said second and third regions being separated by a second p-n junction, and said first region being photoconductive; first and second leads ohmically coupled to said first region, there being a high resistance path through said first region between said first and second leads only when said first region is in a substantially non-illuminated condition; and a third lead ohmically coupled to said third region, said first and third leads being coupled together, and said second and third leads being coupled together through a source of potential, said source of potential back-biasing said second p-n junction beyond voltage breakdown only when there is a high resistance path through said first region between said first and second leads.

3. A photoconductive device comprising: a semiconductor having first, second, and third regions, said first and third regions being of a first conductivity type, said second region being of a second conductivity type, said first and second regions being separated by a first p-n junction, said second and third regions being separated by a second p-n junction, said first region being photoconductive; and back-biasing means coupled to said semiconductor for back-biasing said second p-n junction beyond voltage breakdown only when said first region is in a substantially non-illuminated condition.

4. A semiconductor device comprising: first, second, and third regions, said first and third regions being of a first conductivity type, said second region being of a second conductivity type, said first and second regions being separated by a first p-n junction, said second an third regions being separated by a second p-n junction, and said first region being photoconductive; and back-biasing means in combination therewith for back biasing said second p-n junction beyond voltage breakdown in such a manner that said semiconductor can conduct in the reverse direction only when said first region is in a substantially non-illuminated condition.

References Cited in the file of this patent

UNITED STATES PATENTS

| | | |
|---|---|---|
| 2,570,978 | Pfann | Oct. 9, 1951 |
| 2,744,970 | Shockley | May 8, 1956 |
| 2,779,877 | Lehovec | Jan. 29, 1957 |
| 2,790,088 | Shive | Apr. 23, 1957 |
| 2,846,592 | Rutz | Aug. 5, 1958 |